United States Patent
Cheng et al.

(10) Patent No.: US 10,177,168 B2
(45) Date of Patent: Jan. 8, 2019

(54) FIN FIELD-EFFECT TRANSISTOR HAVING AN OXIDE LAYER UNDER ONE OR MORE OF THE PLURALITY OF FINS

(71) Applicant: International Business Machines Corporation, Armonk, NY (US)

(72) Inventors: Kangguo Cheng, Schenectady, NY (US); Pouya Hashemi, White Plains, NY (US); Alexander Reznicek, Troy, NY (US); Dominic J. Schepis, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/444,559

(22) Filed: Feb. 28, 2017

(65) Prior Publication Data
US 2017/0170205 A1    Jun. 15, 2017

Related U.S. Application Data

(62) Division of application No. 14/947,313, filed on Nov. 20, 2015.

(51) Int. Cl.
*H01L 27/12* (2006.01)
*H01L 21/02* (2006.01)
(Continued)

(52) U.S. Cl.
CPC .... *H01L 27/1211* (2013.01); *H01L 21/02236* (2013.01); *H01L 21/2253* (2013.01);
(Continued)

(58) Field of Classification Search
CPC ............... H01L 27/0886; H01L 29/785; H01L 27/1211; H01L 29/0649; H01L 29/0657;
(Continued)

(56) References Cited

U.S. PATENT DOCUMENTS 7,402,856 B2   7/2008  Brask et al.
7,994,020 B2   8/2011  Lin et al.
(Continued)

FOREIGN PATENT DOCUMENTS

CN        104167361 A      11/2014

OTHER PUBLICATIONS

English translation for Chinese Application No. CN104167361A.
List of IBM Patents or Patent Applications Treated as Related.

*Primary Examiner* — Ermias Woldegeorgis
(74) *Attorney, Agent, or Firm* — L. Jeffrey Kelly; Ryan, Mason & Lewis, LLP

(57) ABSTRACT

A method for manufacturing a semiconductor device comprises forming a first diffusion stop layer on a bulk semiconductor substrate, forming a doped semiconductor layer on the first diffusion stop layer, forming a second diffusion stop layer on the doped semiconductor layer, forming a fin layer on the doped semiconductor layer, patterning the first and second diffusion stop layers, the doped semiconductor layer, the fin layer and a portion of the bulk substrate, oxidizing the doped semiconductor layer to form an oxide layer, and forming a dielectric on the bulk substrate adjacent the patterned portion of the bulk substrate, the patterned first diffusion stop layer and the oxide layer.

20 Claims, 3 Drawing Sheets

(51) Int. Cl.
*H01L 21/225* (2006.01)
*H01L 21/283* (2006.01)
*H01L 27/088* (2006.01)
*H01L 27/092* (2006.01)
*H01L 29/06* (2006.01)
*H01L 29/66* (2006.01)
*H01L 29/78* (2006.01)
*H01L 21/84* (2006.01)
*H01L 29/16* (2006.01)
*H01L 29/161* (2006.01)

(52) U.S. Cl.
CPC ........ *H01L 21/2254* (2013.01); *H01L 21/283* (2013.01); *H01L 21/845* (2013.01); *H01L 27/0886* (2013.01); *H01L 27/0924* (2013.01); *H01L 29/0638* (2013.01); *H01L 29/0649* (2013.01); *H01L 29/0657* (2013.01); *H01L 29/161* (2013.01); *H01L 29/1608* (2013.01); *H01L 29/66795* (2013.01); *H01L 29/66818* (2013.01); *H01L 29/785* (2013.01); *H01L 21/02238* (2013.01); *H01L 21/02255* (2013.01)

(58) Field of Classification Search
CPC ......... H01L 29/66795; H01L 29/66818; H01L 27/0924; H01L 21/02236; H01L 21/2253; H01L 21/2254; H01L 21/283
See application file for complete search history.

(56) References Cited

U.S. PATENT DOCUMENTS

| | | | |
|---|---|---|---|
| 8,101,486 B2 | 1/2012 | Maszara et al. | |
| 8,901,570 B2 | 12/2014 | Aigo et al. | |
| 8,937,005 B2 | 1/2015 | Scudder et al. | |
| 8,993,399 B2 | 3/2015 | Cheng et al. | |
| 9,041,062 B2 | 5/2015 | Cheng et al. | |
| 2005/0239242 A1 | 10/2005 | Zhu et al. | |
| 2011/0068431 A1 | 3/2011 | Knorr et al. | |
| 2013/0082310 A1* | 4/2013 | Yin | H01L 29/66795 257/288 |
| 2014/0339643 A1 | 11/2014 | Cheng et al. | |
| 2014/0353731 A1* | 12/2014 | Colinge | H01L 29/7843 257/288 |
| 2015/0069327 A1 | 3/2015 | Cheng et al. | |
| 2015/0102393 A1 | 4/2015 | Mieno | |
| 2015/0162404 A1 | 6/2015 | Yang et al. | |

* cited by examiner

FIN FIELD-EFFECT TRANSISTOR HAVING AN OXIDE LAYER UNDER ONE OR MORE OF THE PLURALITY OF FINS

TECHNICAL FIELD

The field generally relates to semiconductor devices and methods of manufacturing same and, in particular, to a silicon-on-insulator fin field-effect transistor device formed on a bulk substrate.

BACKGROUND

With respect to fin field-effect transistor (FinFET) devices, bulk substrates, when compared to silicon-on-insulator (SOI) substrates, offer low cost. However, manufacturing a FinFET device on a bulk substrate may lead to variations in fin height and difficulties in controlling device characteristics. On the other hand, SOI substrates can provide little or no variation in fin height and good control and isolation, but are higher in cost when compared with bulk substrates.

With known methods of manufacturing a FinFET device using a bulk substrate, an insulator height, more specifically, a height of a shallow trench isolation (STI) region, defines fin height since the dielectric for the STI region is deposited on the substrate around the formed fins, recessing a bottom portion of each fin. As a result, unwanted device variability, including variations in the electrical characteristics of a device due to the fin height and difficulties isolating the fins, can occur. In contrast, SOI fins are formed on an existing buried dielectric region located below the resulting fins, and therefore STI thickness, when using an SOI substrate, will not significantly change fin height or result in unwanted device variability.

SUMMARY

According to an exemplary embodiment of the present invention, a method for manufacturing a semiconductor device comprises forming a first diffusion stop layer on a bulk semiconductor substrate, forming a doped semiconductor layer on the first diffusion stop layer, forming a second diffusion stop layer on the doped semiconductor layer, forming a fin layer on the doped semiconductor layer, patterning the first and second diffusion stop layers, the doped semiconductor layer, the fin layer and a portion of the bulk substrate, oxidizing the doped semiconductor layer to form an oxide layer, and forming a dielectric on the bulk substrate adjacent the patterned portion of the bulk substrate, the patterned first diffusion stop layer and the oxide layer.

According to an exemplary embodiment of the present invention, a semiconductor device comprises a substrate, a plurality of fins on the substrate, an oxide layer under each of the plurality of fins, a first diffusion stop layer on the substrate and under each oxide layer, a second diffusion stop layer between each oxide layer and a corresponding fin of the plurality of fins, and a gate structure formed on the plurality of fins.

According to an exemplary embodiment of the present invention, a method for manufacturing a semiconductor device comprises forming a stacked configuration of a first diffusion stop layer on a bulk semiconductor substrate, a doped semiconductor layer on the first diffusion stop layer, a second diffusion stop layer on the doped semiconductor layer, and a fin layer on the doped semiconductor layer, patterning the stacked configuration to create one or more patterned stacked configurations each having a smaller width than the stacked configuration, performing an oxidation process, wherein a portion of the doped semiconductor layer corresponding to each of the one or more patterned stacked configurations is converted into an oxide layer, and forming a dielectric on the bulk semiconductor substrate adjacent respective lower portions of the one or more patterned stacked configurations.

These and other exemplary embodiments of the invention will be described in or become apparent from the following detailed description of exemplary embodiments, which is to be read in connection with the accompanying drawings.

BRIEF DESCRIPTION OF THE DRAWINGS

Exemplary embodiments of the present invention will be described below in more detail, with reference to the accompanying drawings, of which.

DETAILED DESCRIPTION

Figure 1:
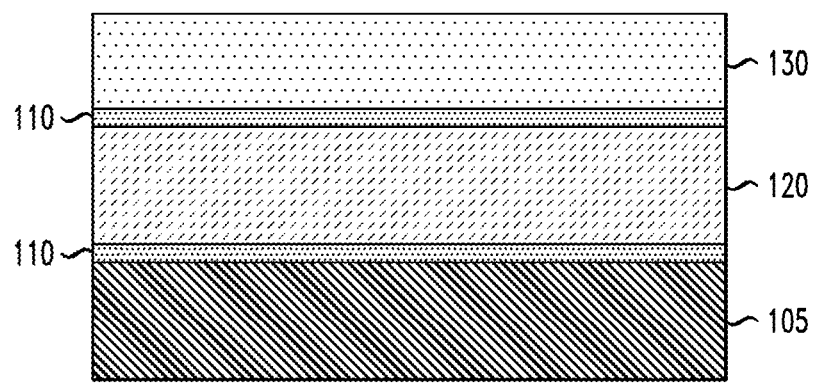
FIG. 1 is a cross-sectional view illustrating fabrication of a semiconductor device taken parallel to a gate extension direction and showing epitaxial growth of different layers on a bulk semiconductor substrate, according to an exemplary embodiment of the present invention.

Exemplary embodiments of the invention will now be discussed in further detail with regard to semiconductor devices and methods of manufacturing same and, in particular, to a silicon-on-insulator fin field-effect transistor device formed on a bulk substrate.

It is to be understood that the various layers and/or regions shown in the accompanying drawings are not drawn to scale, and that one or more layers and/or regions of a type commonly used in FinFET and/or other semiconductor devices may not be explicitly shown in a given drawing. This does not imply that the layers and/or regions not explicitly shown are omitted from the actual devices. In addition, certain elements may be left out of particular views for the sake of clarity and/or simplicity when explanations are not necessarily focused on the omitted elements. Moreover, the same or similar reference numbers used throughout the drawings are used to denote the same or similar features, elements, or structures, and thus, a detailed explanation of the same or similar features, elements, or structures will not be repeated for each of the drawings.

The FinFET devices and methods for forming same in accordance with embodiments of the present invention can be employed in applications, hardware, and/or electronic systems. Suitable hardware and systems for implementing embodiments of the invention may include, but are not limited to, personal computers, communication networks, electronic commerce systems, portable communications devices (e.g., cell and smart phones), solid-state media storage devices, functional circuitry, etc. Systems and hardware incorporating the FinFET devices are contemplated embodiments of the invention. Given the teachings of embodiments of the invention provided herein, one of ordinary skill in the art will be able to contemplate other implementations and applications of embodiments of the invention.

The embodiments of the present invention can be used in connection with semiconductor devices that may require FinFETs. By way of non-limiting example, the semiconductor devices can include, but are not limited to FinFET devices, and/or semiconductor devices that use FinFET technology.

As used herein, "parallel to a gate extension direction" refers to an extension direction of a gate structure perpendicular to a channel length (e.g., perpendicular to a fin extension direction) and to the left and right in the cross-sectional views herein, wherein source/drain regions would be located in front and behind the cross-sectional views. In other words, left and right in these cross-sections represents a width direction of the fin, and the length of the fin and a channel length are going into the page.

As used herein, "perpendicular to a gate extension direction" or "across a channel of a gate structure" refers to a channel length direction of a gate structure (e.g., parallel to a fin extension direction).

As used herein, "height" refers to a vertical size of an element (e.g., a layer, trench, hole, etc.) in the cross-sectional figures measured from a bottom surface to a top surface of the element, and/or measured with respect to a surface on which the element is directly on. Conversely, a "depth" refers to a vertical size of an element (e.g., a layer, trench, hole, etc.) in the cross-sectional figures measured from a top surface to a bottom surface of the element.

As used herein, "lateral," "lateral side," "lateral surface" refers to a side surface of an element (e.g., a layer, etc.), such as a left or right side surface in the cross-sectional figures.

As used herein, "width" refers to a horizontal size of an element (e.g., a layer, trench, hole, etc.) in the figures measured from a left or right side surface to an opposite surface of the element.

Embodiments of the present invention provide a method and structure for forming SOI FinFET areas with a dielectric under silicon fins, wherein the fins are formed on silicon wafers for low cost and industry compatible processing. Embodiments of the invention provide a way to use a bulk silicon, industry standard wafer to manufacture a FinFET device, without a need to use a SOI starting wafer.

In accordance with one or more embodiments of the present invention, the device, which corresponds to the fin height above a dielectric, is defined by the original thickness of the epitaxy films, instead of having a height of fin on a bulk substrate defined by how much a bottom portion of a fin is recessed during a STI process. According to an embodiment of the present invention, a dielectric is formed under a fin, providing the advantages of an SOI substrate, without having to use an SOI substrate, which is typically more expensive than a bulk substrate.

Figure 5:
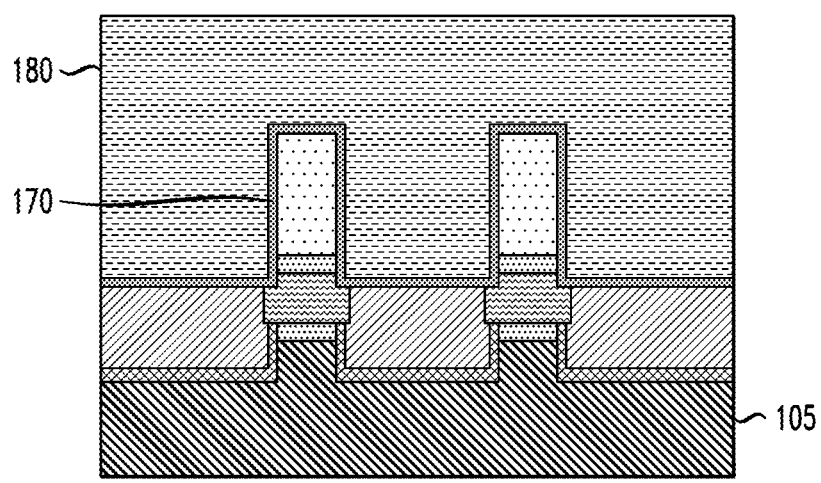
FIG. 5 is a cross-sectional view illustrating fabrication of a semiconductor device taken parallel to a gate extension direction and showing metal gate and dielectric deposition, according to an exemplary embodiment of the present invention.
Figure 6:
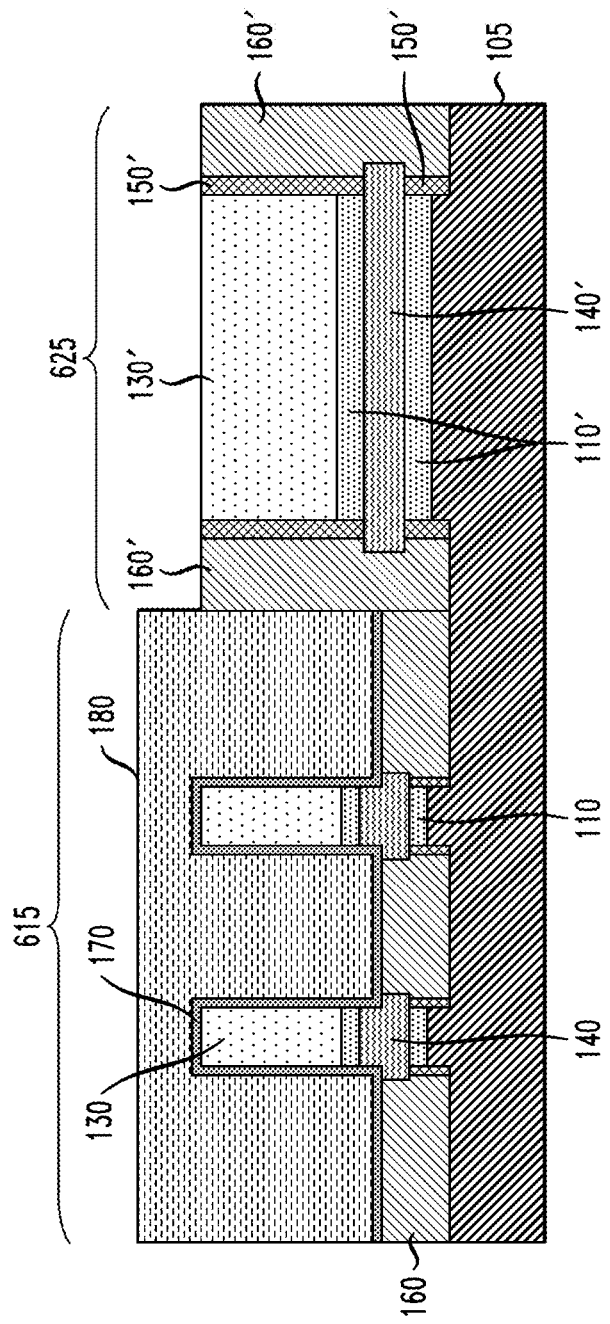
FIG. 6 is a cross-sectional view of a semiconductor device taken parallel to a gate extension direction and illustrating fin and bulk regions, according to an exemplary embodiment of the present invention.

It further relaxes the requirement of gate to the substrate without introducing extra parasitic capacitance. Referring, for example, to FIGS. 5 and 6 described herein below, even when a gate extends beyond the bottom of a fin, the extension of the gate portion overlaps with the dielectric under the fin. Therefore, there is no increase of parasitic capacitance.

In accordance with an embodiment of the present invention, a dielectric thickness under a fin is based on a thickness of an epitaxially grown N+ silicon layer. A thickness of the N+ silicon layer is easily adjusted during the epitaxial growth by controlling a rate and duration of the growth.

According to an embodiment of the present invention, a semiconductor (e.g., Si, SiGe, etc.) fin is produced on top of an insulator (e.g., oxide), using a technique of enhanced oxidation of the N+ silicon layer below the fin, such that only a small portion of the semiconductor fin is oxidized, while an entire portion of the N+ silicon layer underneath the semiconductor fin is completely oxidized. Then an STI oxide can be formed by a deposition and recess process. As a result, a device width is not dependent on an STI region height or erosion of the STI region, but instead is dependent on the height of the fin on insulator.

An embodiment of the present invention utilizes rapid oxidation of N+ doped silicon relative to oxidation of undoped or lightly doped silicon. A silicon substrate is used and silicon:carbon (Si:C) layers are grown above and below an N+ doped silicon layer to prevent diffusion of the N+ dopant into the upper and lower portions of the structure. An upper silicon layer that will become one or more fins is epitaxially grown above an upper Si:C layer.

In accordance with an embodiment of the present invention, a planar structure including the substrate, Si:C layers on upper and lower sides of an N+ doped silicon layer, and an upper silicon layer, is patterned such that fins are formed by anisotropic etching of the upper silicon layer. The upper Si:C layer, the N+ layer, the lower Si:C layer and the silicon substrate are also anisotropically etched. A high-pressure oxidation (HIPOX) process is used on the N+ layer such that the N+ region is converted to silicon dioxide ($SiO_2$) at a much greater rate than the other semiconductor layers. The Si:C layers prevent dopant diffusion into the substrate and the resulting fin. STI can be performed on the resulting structure, effectively forming an SOI fin device without the need for an SOI starting wafer.

FIG. 1 is a cross-sectional view illustrating fabrication of a semiconductor device taken parallel to a gate extension direction and showing epitaxial growth of different layers on a bulk semiconductor substrate, according to an exemplary embodiment of the present invention. Referring to FIG. 1, a semiconductor substrate 105 is a bulk substrate comprising semiconductor material including, but not limited to, Si, silicon germanium (SiGe) or other like semiconductor. In addition, multiple layers of the semiconductor materials can be used as the semiconductor material of the substrate. In accordance with an embodiment of the present invention, as can be seen in FIG. 1, a first diffusion stop layer 110 formed of, for example, Si:C is epitaxially grown on the substrate 105. According to an embodiment, the first diffusion stop layer 110 includes about 1.7% C, and is in the range of about 2 nm to about 5 nm thick.

Terms such as "epitaxial growth" and "epitaxially formed and/or grown" refer to the growth of a semiconductor material on a deposition surface of a semiconductor material, in which the semiconductor material being grown has the same crystalline characteristics as the semiconductor material of the deposition surface. In an epitaxial deposition process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material has the same crystalline characteristics as the deposition surface on which it is formed. For example, an epitaxial semiconductor material deposited on a {100} crystal surface will take on a {100} orientation. In the present application, the first diffusion stop layer 110 has an epitaxial relationship with exposed surfaces of the substrate 105, the N+ doped semiconductor layer 120 has an epitaxial relationship with exposed surfaces of the first diffusion stop layer 110, the second diffusion stop layer 110 has an epitaxial relationship with exposed surfaces of the N+ doped semiconductor layer 120, and the fin layer 130 has an epitaxial relationship with exposed surfaces of the second diffusion stop layer 110.

Examples of various epitaxial growth processes include, for example, rapid thermal chemical vapor deposition (RTCVD), low-energy plasma deposition (LEPD), ultra-high vacuum chemical vapor deposition (UHVCVD), atmospheric pressure chemical vapor deposition (APCVD), liquid-phase epitaxy (LPE), molecular beam epitaxy (MBE) and metal-organic chemical vapor deposition (MOCVD). The temperature for an epitaxial growth process can range from, for example, 550° C. to 900° C., but is not necessarily limited thereto, and may be conducted at higher or lower temperatures as needed.

A number of different sources may be used for the epitaxial growth. For example, the sources may include precursor gas or gas mixture including for example, a silicon containing precursor gas (such as silane) and/or a germanium containing precursor gas (such as a germane). Carrier gases like hydrogen, nitrogen, helium and argon can be used.

An N+ doped semiconductor layer 120, for example, N+ doped silicon, or other semiconductor, is epitaxially grown on the first diffusion stop layer 110. In accordance with an embodiment, the N+ doped semiconductor layer 120 is doped with Arsenic (As) at a concentration of about $3 \times 10^{20}$ cm$^{-3}$ to about $2 \times 10^{21}$ cm$^{-3}$. In accordance with an embodiment of the present invention, a height of the N+ doped semiconductor layer 120 is about 10 nm to about 100 nm. A second diffusion stop layer 110 formed of, for example, Si:C is epitaxially grown on the N+ doped semiconductor layer 120. According to an embodiment, like the first diffusion stop layer 110, second diffusion stop layer 110 includes about 1.7% C, and is in the range of about 2 nm to about 5 nm thick. A fin layer 130, comprising, for example, silicon, is epitaxially grown on the second diffusion stop layer 110. Other materials fin layer 130 can include, for example, SiGe with Ge about 10% to about 30%. In accordance with an embodiment of the present invention, a height of the fin layer 130 can be about 30 nm to about 100 nm. In connection with the epitaxial growth of the diffusion stop layers 110, an epitaxial carbon precursor, such as monomethylsilane, can be used.

Figure 2:
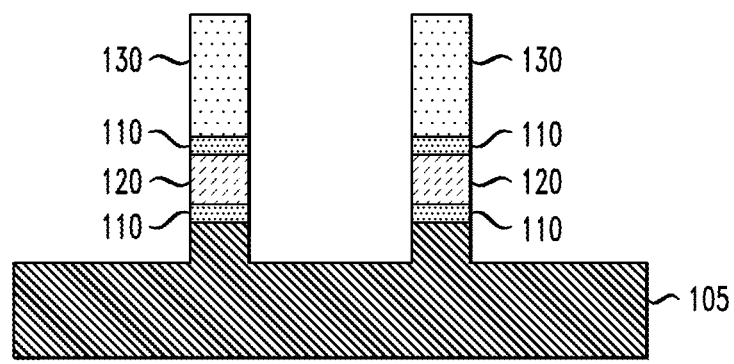
FIG. 2 is a cross-sectional view illustrating fabrication of a semiconductor device taken parallel to a gate extension direction and showing patterning of the layers from FIG. 1, according to an exemplary embodiment of the present invention.

FIG. 2 is a cross-sectional view illustrating fabrication of a semiconductor device taken parallel to a gate extension direction and showing patterning of the layers from FIG. 1, according to an exemplary embodiment of the present invention. Referring to FIG. 2, patterning is performed by a method known in the art, for example, sidewall imaging transfer and etching, such as reactive ion etching (RIE). The layers 130, 120 and 110, including an upper portion of the substrate 105, are patterned to a desired width, for example, including but not limited to, in the range of about 6 nm to about 12 nm, or about 8 nm 10 nm.

Figure 3:
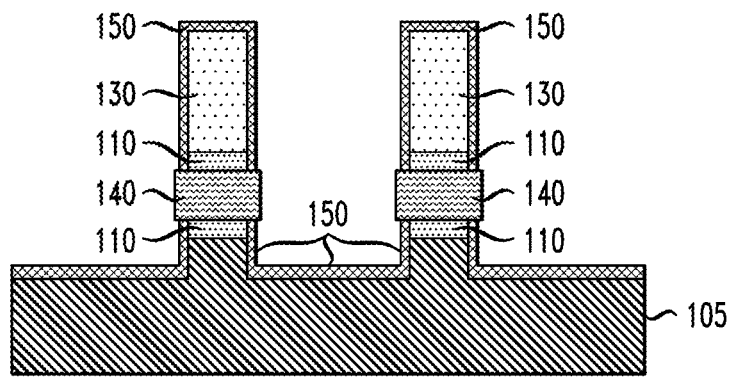
FIG. 3 is a cross-sectional view illustrating fabrication of a semiconductor device taken parallel to a gate extension direction and showing results of an oxidation process, according to an exemplary embodiment of the present invention.

FIG. 3 is a cross-sectional view illustrating fabrication of a semiconductor device taken parallel to a gate extension direction and showing results of an oxidation process, according to an exemplary embodiment of the present invention. Referring to FIG. 3, a high pressure oxidation (HIPOX) process is performed on the patterned layers from FIG. 2 to result in the structure shown in FIG. 3. The HIPOX is performed at, for example, about 20 times to about 50 times atmospheric pressure. During the HIPOX process, the patterned N+ doped semiconductor layer 120, comprising, for example, As, is oxidized faster than the patterned fin 130 and the patterned second diffusion stop layer 110, so that the patterned N+ doped semiconductor layer 120 is fully oxidized to form a thick oxide layer 140, comprising, for example, $SiO_2$. For example, the N+ doped semiconductor layer 120 is oxidized at a rate of about 10 times to about 20 times that of the patterned fin 130 comprising silicon. The oxidized portions of the patterned fin 130, the patterned first and second diffusion stop layers 110, and the substrate 105 result in a thin oxide layer 150, comprising, for example, $SiO_2$, formed around the patterned fin 130, the patterned first and second diffusion stop layers 110, and on the substrate 105.

The first and second diffusion stop layers 110 prevent the As from the N+ doped semiconductor layer 120 from being diffused into the substrate 105, and into the layer 130, which are positioned below and above the N+ doped semiconductor layer 120, respectively. In accordance with an embodiment of the present invention, silicon atoms in the layers 105, 110 and 130 bond with oxygen that is available during the HIPOX process to form the thin oxide 150, and silicon atoms in the layer 120 bond with oxygen that is available during the HIPOX process to form the thick oxide 140.

The HIPOX is performed at a temperature from about 900° C. to about 1200° C. In accordance with an embodiment of the present invention, the HIPOX is performed in an oxidizing ambient which includes at least one oxygen-containing gas such as, for example, $O_2$, NO, $N_2O$, ozone, air and other like oxygen-containing gases. The oxygen-containing gases may be admixed with each other (such as an admixture of $O_2$ and NO), or the gas may be diluted with an inert gas such as, for example, He, Ar, $N_2$, Xe, Kr, or Ne. In accordance with an embodiment of the present invention, the HIPOX may be carried out for a variable period of time. In one example, the HIPOX is carried out for a time period from about 1 min to about 30 min, depending on pressure, oxidation temperature and oxidation species. The HIPOX may be carried out at a single targeted pressure, or various ramp and soak cycles using various ramp rates and soak times can be employed. According to an embodiment, the HIPOX process is performed until the layers 120 are fully consumed to form the thick oxide layers 140.

Figure 4:
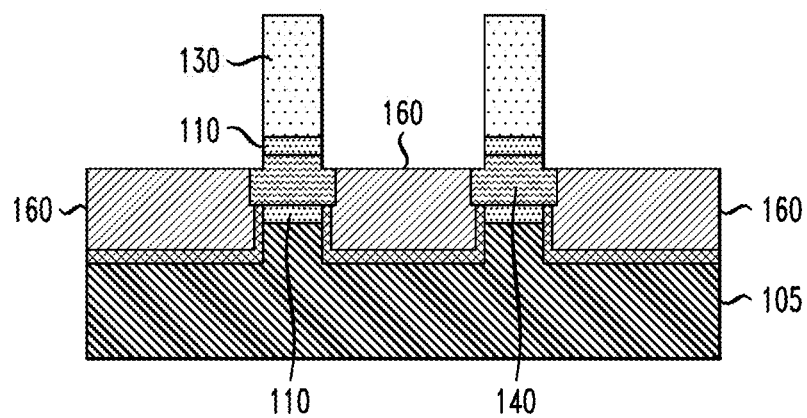
FIG. 4 is a cross-sectional view illustrating fabrication of a semiconductor device taken parallel to a gate extension direction and showing back filling of a dielectric and removal of a portion of the back-filled dielectric, according to an exemplary embodiment of the present invention.

FIG. 4 is a cross-sectional view illustrating fabrication of a semiconductor device taken parallel to a gate extension direction and showing back filling of a dielectric and removal of a portion of the back-filled dielectric, according to an exemplary embodiment of the present invention. In connection with FIG. 4, a dielectric, such as, for example, silicon oxide, silicon nitride, a combination of silicon nitride and silicon oxide, etc., is back filled on the structure of FIG. 3, including on the substrate 105, and on and around the patterned and oxidized layers 110, 130, 140 and 150. The back filling can be performed using deposition techniques, such as, for example, chemical vapor deposition (CVD), plasma enhanced CVD (PECVD), physical vapor deposition (PVD), atomic layer deposition (ALD), molecular beam deposition (MBD), pulsed laser deposition (PLD), and/or liquid source misted chemical deposition (LSMCD), sputtering, and/or plating.

The back filled dielectric is then etched back and planarized using, for example, chemical mechanical planarization (CMP) followed by reactive ion etching (RIE) to form STI regions 160. The thin oxide 150 is removed from the patterned fins 130 and the patterned second diffusion stop layers 110, and a portion of the thick oxide 140 is removed as a result of etching back to form the STI regions 160. The height of the fins 130 is based on the height over the buried thick oxides 140 and is not based on the recessed STI regions 160.

FIG. 5 is a cross-sectional view illustrating fabrication of a semiconductor device taken parallel to a gate extension direction and showing metal gate and dielectric deposition, according to an exemplary embodiment of the present invention. Referring to FIG. 5, a gate structure includes, for example, low resistance metal 180, such as, for example, tungsten, zirconium, tantalum, titanium, aluminum, ruthenium, metal carbides, metal nitrides, transition metal aluminides, tantalum carbide, titanium carbide, tantalum magnesium carbide, or combinations thereof, and high-K dielectric 170 such as, for example, HfO$_2$ (hafnium oxide). The gate structure may be formed using, for example, deposition techniques including, but not limited to, CVD, PECVD, PVD, ALD, MBD, PLD, and/or LSMCD, sputtering, and/or plating. The resulting gate structure is planarized using, for example, CMP. In accordance with an embodiment of the present invention, source/drain regions are formed, and a replacement metal gate (RMG) process is used to form the gate structure.

FIG. 6 is a cross-sectional view of a semiconductor device taken parallel to a gate extension direction and illustrating fin and bulk regions, according to an exemplary embodiment of the present invention. Referring to FIG. 6, a fin region 615 has the same or similar structure to what is shown in FIG. 5, and a bulk region 625 includes the substrate 105, diffusion stop layers 110' including, for example Si:C like to the diffusion stop layers 110, a silicon layer 130' including the same material as the silicon fins 130, an oxide layer 140' including the same material as the oxide layer 140, oxide layers 150' including the same material as the oxide layers 150 and STI regions 160' like the STI regions 160. According to an embodiment of the present invention, the bulk region 625 can be used for forming auxiliary devices such as electrostatic discharge (ESD) devices.

Although illustrative embodiments of the present invention have been described herein with reference to the accompanying drawings, it is to be understood that the invention is not limited to those precise embodiments, and that various other changes and modifications may be made by one skilled in the art without departing from the scope or spirit of the invention.

We claim:

1. A semiconductor device, comprising:
   a substrate;
   a plurality of fins on the substrate;
   an oxide layer under each of the plurality of fins;
   a first diffusion stop layer on the substrate and under each oxide layer;
   a second diffusion stop layer between each oxide layer and a corresponding fin of the plurality of fins;
   a gate structure formed on the plurality of fins;
   a plurality of isolation regions adjacent respective oxide layers and corresponding first diffusion stop layers under the respective oxide layers; and
   dielectric layers on sides of the first diffusion stop layers between the plurality of isolation regions and the first diffusion stop layers,
   wherein each oxide layer comprises a first material, and the first and second diffusion stop layers comprise a second material different from the first material.

2. The semiconductor device of claim 1, further comprising a bulk region on the substrate comprising:
   another oxide layer; and
   third and fourth diffusion stop layers respectively on bottom and top sides of the other oxide layer.

3. The semiconductor device of claim 2, wherein a location of the other oxide layer laterally corresponds to a location of the oxide layers under each of the plurality of fins on the substrate.

4. The semiconductor device of claim 2, wherein locations of the third and fourth diffusion stop layers laterally correspond to locations of the first and second diffusion stop layers, respectively, on the substrate.

5. The semiconductor device according to claim 1, wherein the second material comprises Si:C.

6. The semiconductor device according to claim 1, wherein the gate structure comprises:
   a high-K dielectric on the plurality of isolation regions and on the plurality of fins; and
   a metal gate on the high-K dielectric.

7. The semiconductor device according to claim 1, wherein the plurality of isolation regions are further adjacent to portions of the substrate protruding toward each first diffusion stop layer under each of the respective oxide layers.

8. The semiconductor device of claim 1, wherein portions of the substrate protrude toward each first diffusion stop layer under each of the oxide layers.

9. The semiconductor device according to claim 1, wherein the width of each of the first and second diffusion stop layers is the same as the width of their corresponding fin.

10. A semiconductor device, comprising:
    a substrate;
    a fin on the substrate;
    an oxide layer under the fin;
    a first diffusion stop layer on the substrate and under the oxide layer;
    a second diffusion stop layer between the oxide layer and the fin;
    a gate structure formed on the fin;
    a plurality of isolation regions adjacent the oxide layer and the first diffusion stop layer under the oxide layer; and
    dielectric layers on sides of the first diffusion stop layer between the plurality of isolation regions and the first diffusion stop layer,
    wherein the oxide layer comprises a first material, and the first and second diffusion stop layers comprise a second material different from the first material.

11. The semiconductor device of claim 10, further comprising a bulk region on the substrate comprising:
    another oxide layer; and
    third and fourth diffusion stop layers respectively on bottom and top sides of the other oxide layer.

12. The semiconductor device of claim 11, wherein a location of the other oxide layer laterally corresponds to a location of the oxide layer on the substrate.

13. The semiconductor device of claim 11, wherein locations of the third and fourth diffusion stop layers laterally correspond to locations of the first and second diffusion stop layers, respectively, on the substrate.

14. The semiconductor device according to claim 10, wherein the second material comprises Si:C.

15. The semiconductor device according to claim 10, wherein the gate structure comprises:
    a high-K dielectric on the plurality of isolation regions and on the fin; and
    a metal gate on the high-K dielectric.

16. The semiconductor device according to claim 10, wherein the plurality of isolation regions are further adjacent to a portion of the substrate protruding toward the first diffusion stop layer under the oxide layer.

17. The semiconductor device of claim 10, wherein a portion of the substrate protrudes toward the first diffusion stop layer under the oxide layer.

18. The semiconductor device according to claim 10, wherein the width of each of the first and second diffusion stop layers is the same as the width of the fin.

19. A semiconductor device, comprising:
    a substrate;
    an epitaxial layer on the substrate;
    an oxide layer under the epitaxial layer;
    a first diffusion stop layer on the substrate and under the oxide layer;
    a second diffusion stop layer between the oxide layer and the epitaxial layer;
    a gate structure formed on the epitaxial layer;
    a plurality of isolation regions adjacent the oxide layer and the first diffusion stop layer under the oxide layer; and
    dielectric layers on sides of the first diffusion stop layer between the plurality of isolation regions and the first diffusion stop layer,
    wherein the oxide layer comprises a first material, and the first and second diffusion stop layers comprise a second material different from the first material.

20. The semiconductor device according to claim 19, wherein the second material comprises Si:C.

* * * * *